(12) United States Patent
Malcolm et al.

(10) Patent No.: US 6,356,740 B1
(45) Date of Patent: Mar. 12, 2002

(54) METHOD AND SYSTEM OF FREQUENCY STABILIZATION IN A MOBILE SATELLITE COMMUNICATION SYSTEM

(75) Inventors: James E. Malcolm, Bethesda; Robert C. Marquart, Germantown, both of MD (US)

(73) Assignee: Hughes Electronics Corporation, Los Angeles, CA (US)

( * ) Notice: Subject to any disclaimer, the term of this patent is extended or adjusted under 35 U.S.C. 154(b) by 0 days.

(21) Appl. No.: 08/497,333

(22) Filed: Jun. 30, 1995

(51) Int. Cl.$^7$ .............................. H04B 1/00; H04B 7/00
(52) U.S. Cl. ........................ 455/71; 455/70; 455/12.1
(58) Field of Search .................. 455/10, 12.1, 13.1, 455/13.2, 33.1, 13.3, 54.1, 71, 68, 69, 70, 524

(56) References Cited

U.S. PATENT DOCUMENTS

| | | | | |
|---|---|---|---|---|
| 4,509,200 A | * | 4/1985 | Luginbuhl et al. | 455/13.2 |
| 4,901,368 A | * | 2/1990 | Arnold et al. | 455/12.1 |
| 5,323,164 A | * | 6/1994 | Endo | 455/12.1 |
| 5,432,521 A | * | 7/1995 | Siwiak et al. | 455/12.1 |
| 5,463,400 A | * | 10/1995 | Tayloe | 455/12.1 |
| 5,471,648 A | * | 11/1995 | Gourgue | 455/12.1 |
| 5,471,657 A | * | 11/1995 | Gharpuray | 455/12.1 |
| 5,542,095 A | * | 7/1996 | Petranovick | 455/71 |
| 5,613,193 A | * | 3/1997 | Ishikawa et al. | 455/12.1 |

* cited by examiner

Primary Examiner—Reinhard J. Eisenzopf
Assistant Examiner—Marsha D. Banks-Harold

(57) ABSTRACT

The present invention relates generally to satellite communication systems, and more particularly to a method and system for stabilizing transmission frequencies in a mobile satellite communication system. The preferred embodiment of the invention involves adjusting the transmit frequency of the gateway to account for a frequency shift from the reference frequency on the link between the gateway and the satellite. The preferred method of stabilizing the transmission frequency of a mobile terminal in a mobile satellite communication system involves receiving frequency offset information transmitted by a gateway in the mobile satellite system, and adjusting a reference oscillator in a mobile terminal based on the frequency offset information. The preferred embodiment of the system includes a plurality of mobile terminals, a satellite adapted to communicate with the mobile terminals, and a gateway in communication with the satellite. Each mobile terminal has a mobile terminal reference oscillator, and the satellite has a satellite reference oscillator. The gateway has a high-stability reference oscillator and a digital processor. The digital processor includes a routine for calculating a frequency offset, such as reference oscillator drift. The gateway transmits the frequency offset to at least one of the mobile terminals via the satellite. At least one of the mobile terminals receives the frequency offset and adjusts the mobile terminal reference oscillator to compensate for the received frequency offset.

26 Claims, 2 Drawing Sheets

METHOD AND SYSTEM OF FREQUENCY STABILIZATION IN A MOBILE SATELLITE COMMUNICATION SYSTEM

BACKGROUND OF THE INVENTION

A mobile satellite communication system typically includes at least one satellite, at least one fixed ground terminal such as a gateway, and many mobile terminals. The mobile terminals may communicate with the gateway or other mobile terminals via the satellite over communication channels. In such systems, many carrier signals provide the communication channels for a given geographic area. Each carrier signal occupies a different frequency band within an allocated frequency spectrum. Each band within the frequency spectrum is separated by an inter-channel guard band to avoid interference between channels. Since there is a limited amount of frequency spectrum allocated to the satellite communication system, it is desirable to minimize the inter-channel guard band. The inter-channel guard band can be minimized when each carrier signal is closely maintained at the proper frequency for that channel.

However, there are many sources for frequency errors in the mobile satellite communication system. Such errors include independent frequency reference oscillator errors in each mobile terminal and in each gateway, frequency translation errors at the satellite, and doppler induced frequency errors due to satellite or mobile terminal motion.

A conventional method of providing an accurate frequency reference requires placing a high-stability frequency oscillator in each satellite in the system. In such a method, the mobile terminals and the gateway synchronize to signals received from the satellite. However, placing high-stability frequency oscillators in a satellite is expensive and potentially unreliable. For example, if the satellite high-stability oscillator fails, the cost of fixing the satellite oscillator may be enormous, e.g. the cost of retrieving and fixing the satellite or launching a new satellite. Accordingly, there is a need for a less expensive and more reliable method of stabilizing transmission frequencies in a mobile satellite communication system.

SUMMARY OF THE INVENTION

The present invention relates generally to satellite communication systems, and more particularly to a method and system for stabilizing transmission frequencies in a mobile satellite communication system. The present invention allows a single high-stability oscillator to be placed on the ground, and the frequency offsets from other terminals and satellites to be corrected accordingly. The present invention eliminates the need for a placing a high-stability oscillator in remote satellites or terminals.

The preferred method of stabilizing the transmission frequency of a mobile satellite communication system involves placing a high-stability oscillator in a ground-based gateway terminal. Preferably, the high-stability oscillator produces a reference signal to derive all transmit and receive frequencies for the system. Based on the satellite ephemris, the gateway terminal determines the frequency shift introduced on the uplink to the satellite. The gateway then adjusts its transmit frequency to compensate for the shift so that the signal recieved by the satellite is at the reference frequency.

A preferred embodiment of the invention also involves receiving frequency offset information transmitted by the gateway, and adjusting a reference oscillator in a mobile terminal based on the frequency offset information. Preferably, the mobile terminal also transmits a first signal to the gateway, and the gateway measures a mobile terminal frequency offset from the first signal. The gateway preferably transmits the mobile terminal frequency offset to the mobile terminal, and the mobile terminal adjusts its reference oscillator to compensate for the mobile terminal frequency offset.

A preferred embodiment also involves placing a call between the mobile terminal and the gateway, measuring a mobile terminal frequency drift offset at the gateway, reporting the mobile terminal frequency drift offset to the mobile terminal, and adjusting the reference oscillator in the mobile terminal to compensate for the mobile terminal frequency drift offset.

Another preferred embodiment provides a method of stabilizing a communication frequency in a mobile to mobile call placed over a satellite mobile communication system. The preferred method provides a first mobile terminal having a reference oscillator, and a second mobile terminal. A call is placed between the first mobile terminal and the second mobile terminal. A forward control channel is monitored at the second mobile terminal, and messages are transmitted from the first mobile terminal to the second mobile terminal over a traffic channel during the call. A frequency offset in the first mobile is determined by comparing the frequency of the traffic channel received by the second mobile to the frequency of the forward control channel received at the second mobile. The frequency offset to the first mobile is reported, and the reference oscillator is adjusted to compensate for the frequency offset.

The preferred embodiment of the system includes a plurality of mobile terminals, a satellite adapted to communicate with the mobile terminals, and a gateway in communication with the satellite. Each mobile terminal has a mobile terminal reference oscillator, and the satellite has a satellite reference oscillator. The gateway has a high-stability reference oscillator and a digital processor. The digital processor includes a routine for calculating a frequency offset, such as reference oscillator drift. The gateway transmits the frequency offset to at least one of the mobile terminals via the satellite. Preferably, the gateway periodically transmits the frequency offset to each of the mobile terminals. At least one of the mobile terminals receives the frequency offset and adjusts the mobile terminal reference oscillator to compensate for the received frequency offset.

In a preferred embodiment, each satellite communicates with the mobile terminals by transmitting and receiving signals over a plurality of spot beams, each spot beam having a coverage region and at least one control channel. Also the routine in the gateway preferably calculates a plurality of frequency offsets, where each of the calculated frequency offsets is associated with one of the spot beams. Preferably, each frequency offset is calculated based on the position of the coverage region for the associated spot beam. In addition, the gateway preferably transmits the frequency offsets over the control channels to the mobile terminals.

The invention, together with further objects and attendant advantages, will best be understood by reference to the following detailed description, taken in conjunction with the accompanying drawings.

DETAILED DESCRIPTION OF THE PREFERRED EMBODIMENTS

Figure 1:
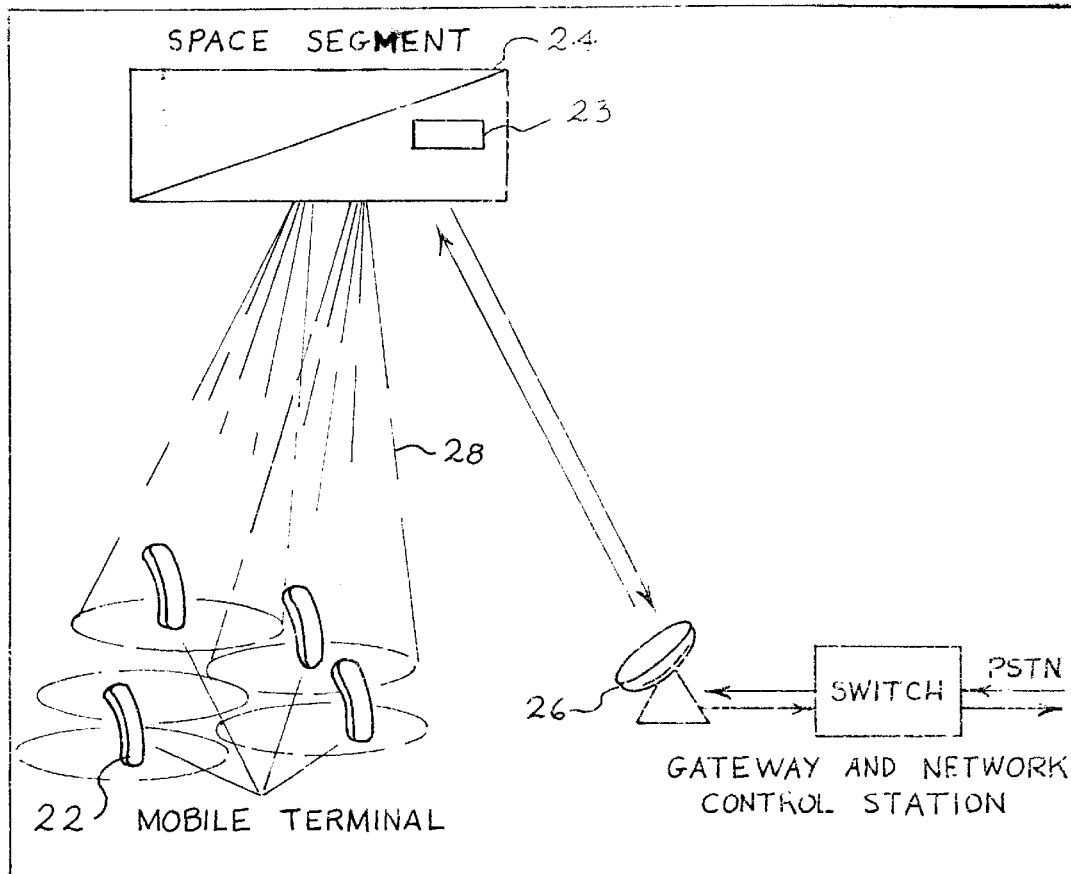
FIG. 1 is a block diagram of a preferred embodiment of a mobile satellite communication system.

Referring now to the drawings, and more particularly to FIG. 1, a preferred embodiment of a mobile satellite communication system 20 is illustrated. The mobile communication system 20 includes at least one mobile terminal 22, at least one space segment 24 such as a satellite, and at least one gateway earth station 26.

The mobile terminal 22 is preferably either a handheld phone or a vehicle mounted unit. The term mobile terminal indicates that a terminal may be used by a mobile user. It is well known in the art that a mobile terminal can also be operated in a fixed station, thus, the term mobile terminal also includes fixed terminals. The use of the term mobile terminal in this description, therefore, can also encompass fixed terminals.

The mobile terminal 22 communicates with the space segment 24 via an L-band frequency in a spot beam 28. Each spot beam 28 is associated with a predetermined geographic region. The gateway 26 communicates with the space segment 24 over a Ku band frequency. The space segment 24 includes transponders for translating between the L-band spot beam signals used by the mobile terminals 22 and the Ku-Band signals used by the gateways 26. The gateway 26 interfaces with a terrestrial telephony carrier, such as the public switched telephone network (PSTN), and may also interface with a cellular network. Thus, a user may place a call on the mobile terminal 22 to either a land line user over the PSTN or to a cellular phone user over the cellular network.

The space segment 24 preferably provides L-band-to-L-band bent pipe single hop communication to support mobile to mobile communication. At the space segment 24, the L-band uplink and downlink are transmitted via multiple spot beams. In the preferred embodiments, small spot size within each spot beam 28 provides a link margin allowing the satellite 24 to communicate with low power mobile terminals 22. In addition, the preferred embodiment provides for frequency reuse so that many, preferably about 16,000, users may be served using a limited amount of L-band spectrum. Preferably, the bandwidth of each spot beam 28 can be varied to accommodate changing traffic patterns.

Subscribers to the system have a unique telephone number that allows them to receive calls when they are registered in a space segment 24 coverage area. A registration procedure locates the mobile 22 within a particular spot beam 28 coverage area when the mobile terminal 22 is turned on.

The mobile terminal 22 can receive calls from any terrestrial facility by connecting the call through one of the gateway stations 26. At this point, the gateway 26 determines the location of the mobile 22 and sends a message to the mobile terminal 22 to announce the incoming call.

The system 20 utilizes low rate encoded voice transmission. Preferably, some of the mobiles 22 are dual mode, allowing voice communications either via satellite or via the local cellular system. The gateway earth station 26 provides for user mobility as the user's mobile terminal 22 moves from spot beam 28 to spot beam 28.

In addition to the communication channels carried by the space segment 24, some of the space segment resources are used for control functions. In the preferred embodiment, one or more channel in each spot beam 28 are control channels. For example, the gateway station 26 places a forward control signal in each spot beam 28 to allow synchronization of the mobile terminals 22 and to carry network control information from the gateway station 26 to the mobile terminals 22.

The forward control channels allow mobile terminals 22 to acquire a satellite carrier and identify the spot beam 28 and gateway station 26 that originates the signal. The gateway 26 uses the forward control channel to page mobiles 22 using their unique address to announce mobile terminated calls.

Each spot beam 28 preferably contains a return direction signaling channel that mobile terminals 22 use to initiate calls or to register with the gateway 26.

During a call, in-band low data rate control channels are preferably available between the mobile 22 and the gateway 26 for call supervision, power control, and to indicate call termination.

Figure 2:
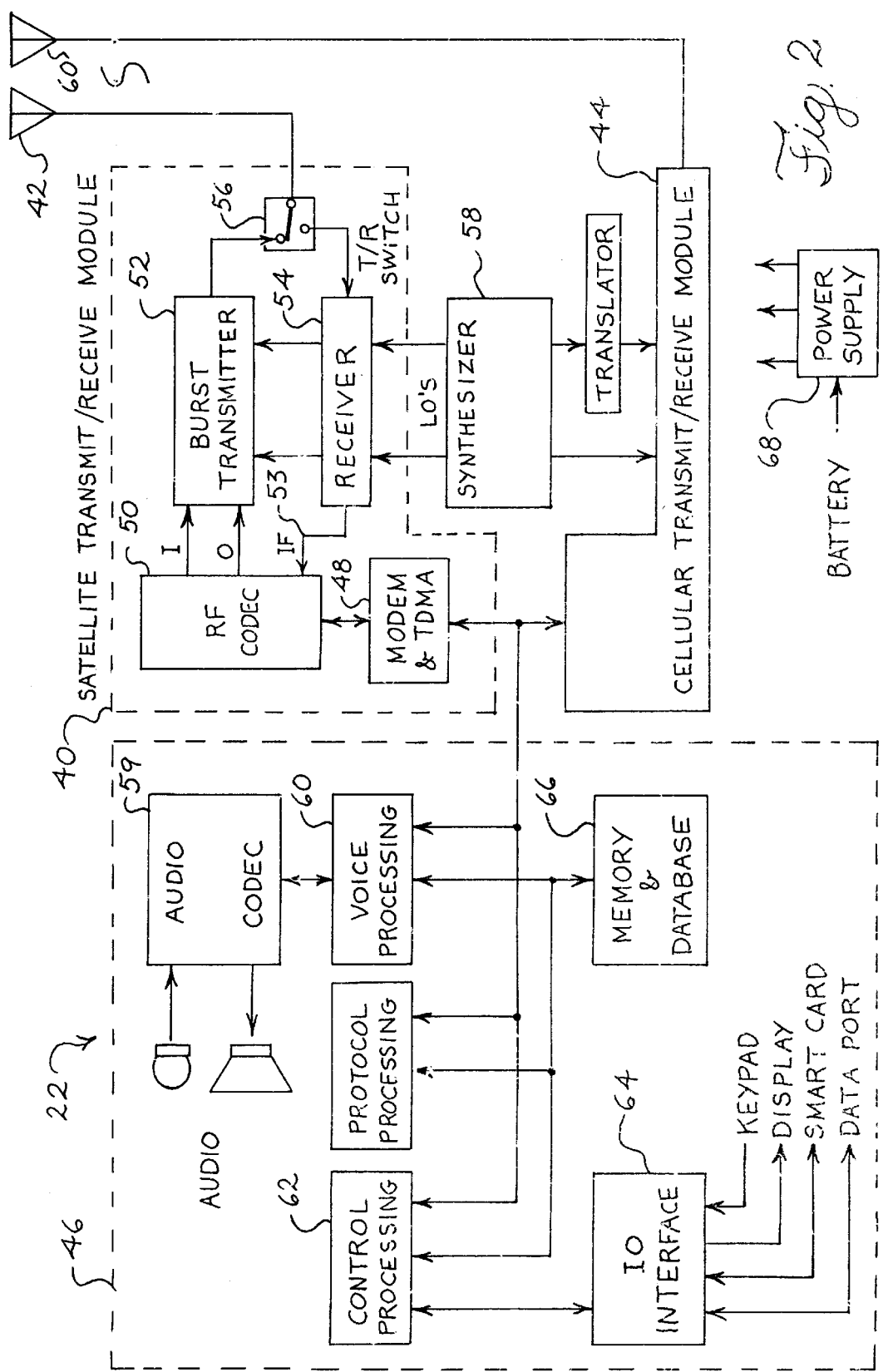
FIG. 2 is a block diagram of a preferred embodiment of a mobile terminal for use in the mobile satellite communication system of FIG. 1.

A preferred embodiment of a mobile terminal 22 is shown in FIG. 2. The mobile terminal 22 includes a satellite module 40, a satellite antenna 42, a cellular module 44, and a user interface module 46. The satellite module 40 is coupled to the user interface module 46, the cellular module 44, and the satellite antenna 42. Preferably, the satellite antenna 42 is a physically small antenna, such as a helix type antenna. The satellite module 40 includes a modem and TDMA unit 48, an RF coder and decoder 50, a burst transmitter 52, a receiver 54, and a transmit or receive (T/R) switch 56. In the preferred embodiment, the modem 48 is connected to the RF codec 50, and the RF coded 50 is connected to the burst transmitter 52 and to the receiver 54. The T/R switch 56 is connected to the burst transmitter 52, the receiver 54, and the satellite antenna 42.

Within the satellite module 40, the modem 48 converts speech or data samples to and from channel symbols using quadrature phase shift key modulation (QPSK). The QPSK is preferably performed digitally an application specific integrated circuit or alternatively on a commercially available digital signal processor. The RF codec 50 converts channel symbols from the modem 48 into baseband I and Q signals that are transmitted to the burst transmitter 52. In the receive direction, the RF codec 50 processes an IF signal 53 from the receiver 54 for input to the modem 48.

The burst transmitter 52 converts the I and Q signals from the RF codec 50 up to a desired frequency, preferably an L-band frequency, for transmission by the first antenna 42. The receiver 54 converts a received L-band signal from the first antenna 42 into the IF signal 53 sent to the RF codec 50.

The T/R switch 56 allows the mobile terminal 22 to either transmit data or receive data. Since the preferred mobile terminal 22 does not transmit and receive simultaneously, the mobile terminal 22 does not need a large filter to isolate the transmission and reception paths. Many conventional mobile terminals require a diplexor or similar device to perform such filtering. However, conventional mobile terminals 22 with diplexors are more costly, weigh more, and add approximately one-half dB of undesirable insertion loss.

The mobile terminal 22 also includes a synthesizer 58 that provides a fixed local oscillator signal for the RF codec 50. The synthesizer 58 includes a variable local oscillator for channel tuning within the satellite module 40 and generates data clock signals for the modem 48. Both the fixed local oscillator and the variable local oscillator within the synthesizer 58 may be adjusted based on commands from either the gateway 26 or from another mobile terminal 22. In the preferred embodiment, the synthesizer 58 is connected to the receiver 54 and to the cellular module 44.

The user interface module 46 includes an audio and codec unit 59, a voice processing unit 60, a controller 62, an input/output (I/O) interface 64, and a memory 66. Preferably, each element within the user interface module 46 communicates with the other user interface elements.

The audio unit 59 digitizes an audio analog signal from a telephone handset (not shown) into a digital 64 Kilobit per second (Kb/s) pulse code modulation (PCM) signal. The audio unit 59 also converts digital PCM signals into an audio signal transmitted to the telephone handset (not shown).

The voice processing unit 60 includes a voice transcoder that performs source coding to compress the digital 64 Kb/s PCM signal. Specifically, an encoder running on a programmable digital signal processor, such as a low delay CELP encoder, compresses the 64 Kb/s PCM signal into approximately a 3.6 Kb/s encoded signal. Alternatively, the encoder may be a multibased excited (MBE) type 3.6 Kb/s encoder that is well known to those skilled in the art. Both the CELP type and the MBE type encoder produce an output having a voice quality which has been measured as having a MOS of 3.2. Of course, if an application allows a lower quality voice signal, such as in a military application, even lower rate encoding could be used.

The controller 62 preferably provides a multi-tasking firmware environment for monitoring and controlling the mobile terminal hardware. The controller 62 may occupy the same processor as the voice transcoder or may optionally be disposed on a separate processor. Preferably, the controller 62 includes an I/O interface 64 that provides a communication interface with a user. The I/O interface 64 includes a keypad, for data entry such as a phone number, a display, a data port, for digital communication such as a facsimile transmission, and a smart card interface as specified for GSM.

The cellular module 44 allows the mobile terminal 22 to communicate with a cellular system over a second antenna 60. The second antenna is a linearly polarized whip meeting cellular system stand and the cellular module 44 uses standard components, such as a GSM chip set, known to those skilled in the art. Preferably, the mobile terminal 22 preferably operates in a first mode where the terminal 22 functions as a conventional cellular phone. In a second mode, the mobile terminal 22 preferably operates so that the mobile terminal 22 communicates with the satellite 24. A battery 68 is provided for portable operation of the mobile terminal 22.

The preferred mobile terminal 22 has many advantages. For example, the mobile terminal 22 provides dual-mode operation, either cellular or satellite. Also, the mobile terminal 22 provides high quality digital voice with a measured MOS score from about 3.2 to 4.0. Further, the mobile terminal 22 allows for paging and messaging, transmission at a 2400 or 4800 bps data rate via the data port, and provides a convenient cellular-like interface. Also, the mobile terminal 22 may transmit on a single channel using a single time slot within a carrier signal allowing many other mobile terminals 22 to transmit over the same carrier. Thus, the mobile terminal 22 efficiently transmits over scarce L-band frequency resources.

Figure 3:
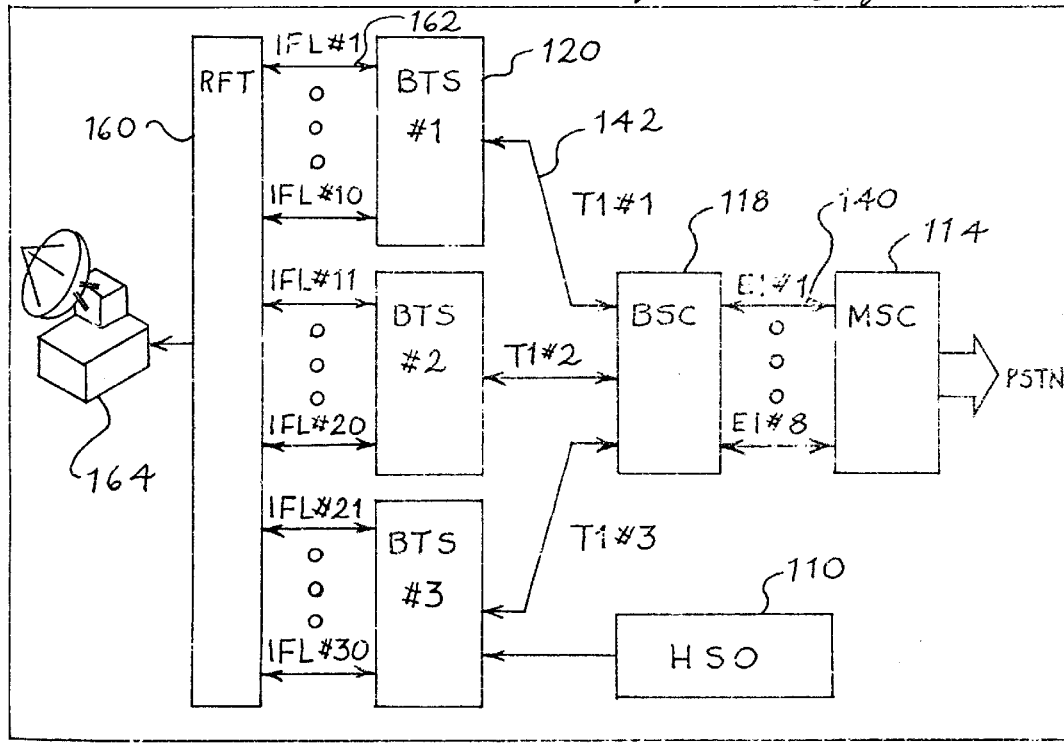
FIG. 3 is a block diagram of a preferred embodiment of a gateway earth station for use in the mobile satellite communication system of FIG. 1.

FIG. 3 is a block diagram of a preferred embodiment of a gateway 26. The gateway 26 includes a mobile switching center (MSC) 114, a plurality of base station controllers (BSCs) 118, a plurality of base transceiver stations (BTS) 120, a radio frequency unit 160, and a high-stability oscillator (HSO) 110. The MSC 114 allows communication with the public switched telephone network (PSTN) and other mobile switching centers. The MSC 114 is connected, preferably by an A-interface 140 such as a standard E1 or E3 line, with at least one BSC 118. The BSC 118 is connected through a communication channel 142, such as a T1 line, to one or more of the base transceiver stations (BTS) 120. Each BTS 120 may communicate over an RF frequency with a mobile terminal 22. The HSO 110 provides a reference frequency signal to the BSC 118 and the BTS 120. The HSO preferably has an accuracy of $\pm 1 \times 10^8$.

A telephone "call" may be originated from the mobile terminal 22 by transmitting initialization data up to the space segment 24 over a control channel and then down to the gateway 26. In the preferred embodiment, the control channel is received over a time slot within a frequency assigned to a spot beam 28 having a coverage area surrounding the mobile terminal 22. At the gateway 26, the call is transmitted/received via an RF channel in the radio frequency unit 160 to the BTS 120 assigned to the spot beam 28 servicing the mobile terminal 22. From the BTS 120, the call is routed to the BSC 118, and then to the MSC 114. From the MSC 114, the call is routed to either the PSTN or another MSC. Thereafter, a communication channel is established through the entire gateway 26, and a subscriber using the mobile terminal 22 may communicate over the established communication channel.

Calls may also originate from either the PSTN or another MSC. Such a call enters the gateway 26 at the MSC 114 and is routed to one of the BSCs 118. The BSC 118 then pages the mobile subscriber 22 via the appropriate BTS 120. After the mobile subscriber 22 responds to the page from the BTS 120, a communication channel is established.

Frequency stabilization in the system 20 is desirable to minimize the bandwidth consumed by inter-channel guard bands and to allow non-interfering communication between geographically disparate Gateway Earth Stations (GES) 26 and the large number of mobile terminals 22 distributed over the satellite L-band footprint. The preferred frequency stabilization implementation is designed to overcome frequency errors introduced by independent frequency references at the ground stations, frequency translation errors at the satellite, doppler due to satellite motion, frequency reference errors at each mobile terminal, and doppler due to mobile terminal motion.

In the preferred embodiment, mobile terminals 22 can switch between traffic bursts from another mobile terminal 22 and control bursts from a gateway 26. In this embodiment, all signals reaching the mobile terminal 22 should have about the same frequency error.

In the preferred embodiment, each element in the network 20 adjusts its transmit frequency to compensate for doppler due to satellite motion so that transmitted signals arrive at the satellite 24 at a nominal frequency. Thus, signals arriving at the mobile terminal 22 theoretically should only have a frequency offset due to frequency translation error in the satellite 24 and downlink doppler due to relative motion between the satellite 24 and the mobile terminal 22.

In the preferred embodiment, the frequency stabilization method provides control of mobile terminals 22 during mobile 22 to gateway 26 calls and mobile 22 to mobile 22 calls. In addition, the preferred frequency stabilization implementation provides a high degree of immunity to traffic disruption due to single point failures.

The preferred embodiment requires that the satellite ephemeris is available to the gateway earth stations 26 in the network 20. The geographic location of the gateway earth stations 26 and the geographic center of each spot beam 28 should be available to the gateway 26.

The satellite 24 provides a single frequency reference for frequency translation functions. Preferably, the satellite 24 provides adequate stability for the onboard frequency reference without control or stabilization from the ground network. Alternatively, the satellite 24 may stabilize its frequency reference 230 via an outbound symbol clock in a Payload Control Channel (PCC) and/or a Dynamic Control Channel (DCC) transmitted from a System Control Station (SCS) located on the ground. The short term stability of the free running onboard frequency reference generator 230 should allow the network 20 to continue to handle calls that do not require action by the SCS in the event of failure of the SCS until a switchover to a redundant SCS can be accomplished.

At each gateway 26 in the system 20, a local frequency reference, such as the high-stability oscillator 110, with an absolute accuracy of $\pm 1.0 \times 10^{-8}$ shall be used to derive all transmit carrier and symbol clock frequencies. The same local frequency reference provides transmit and receive frequency translations and thereby provides accurate signal transmission from the gateway 26 to the satellite 24. Based on the satellite ephemeris, each gateway 26 calculates a frequency shift that is introduced on the Ku-band uplink and downlink signals due to relative motion of the satellite 24 toward the GES 26 ($\text{Dplr}_{SAT\text{-}GES\text{-}UP}$) and ($\text{Dplr}_{SAT\text{-}GES\text{-}DN}$). The GES 26 preferably adjusts its transmit frequency to compensate for the doppler introduced on the uplink. That is, the GES 26 preferably transmits on the nominal uplink frequency ($F_{NOM\text{-}UP}$) minus the uplink doppler ($\text{Dplr}_{SAT\text{-}GES\text{-}UP}$). The preferred carrier frequency transmitted by the GES ($F_{GES\text{-}Tx}$) is then:

$$F_{GES\text{-}Tx} = F_{NOM\text{-}UP} - \text{Dplr}_{SAT\text{-}GES\text{-}UP}$$

At the satellite, carriers received from the GES 26 ($F_{SAT\text{-}Rx\text{-}GES}$) thus appear at the nominal frequency ($F_{NOM\text{-}UP}$).

$$F_{SAT\text{-}Rx\text{-}GES} = F_{GES\text{-}Tx} + \text{Dplr}_{SAT\text{-}GES\text{-}UP} = F_{NOM\text{-}UP}$$

Mobile terminal frequency stabilization is aided by broadcasting frequency correction information from one of the gateways 26 to each of the mobile terminals 22. The gateway 26 preferably determines a satellite frequency translation error and a doppler induced error due to satellite motion toward the center of each spot beam 28. Satellite frequency translation error and spot beam specific doppler error information is preferably broadcast over the forward control channels originating at the gateway 26. Each mobile terminal 22 in a spot beam 28 receives the satellite frequency offset from the gateway 26. In the preferred embodiment, the satellite frequency offset is due to satellite frequency translation error and due to satellite motion toward the geographic center of the spot beam 28. The mobile terminal 22 tunes its transmit 52 and receive 54 circuits based on the received satellite translation error and spot beam specific doppler information.

Once adjusted to the correct tuning frequency, the mobile terminal 22 adjusts its reference oscillator control circuits within the synthesizer 58 until the forward control channel is received at the corrected tuning setting of the receiver. By compensating for satellite frequency translation error and satellite motion induced doppler, the mobile terminal 22 removes all but a small residual error frequency error due to the mobile terminal's position relative to the center of the spot beam 28 and due to mobile terminal 22 motion on the earth's surface. The residual error may be removed following mobile terminal transmission on a contention access channel (CAC). On receipt of the mobile terminal's CAC transmission, the gateway 26 measures the residual error and reports the error back to the mobile terminal 22 on an access response channel (ARC). After receiving and applying residual error correction information, the mobile terminal 22 has compensated for frequency errors due to satellite translation and motion, and mobile terminal relative position, motion, and internal reference errors.

After frequency translation at the satellite 24, carriers transmitted by a GES 26 appear on the downlink at the satellite 24 ($F_{SAT\text{-}Tx\text{-}GES}$) with a frequency error that is due to the satellite frequency translation error ($\text{Err}_{SAT}$).

$$F_{SAT\text{-}Tx\text{-}GES} = F_{NOM\text{-}DN} - \text{Err}_{SAT}$$

Each gateway 26 preferably monitors its own transmission by receiving the Ku-band downlink. The received frequency ($F_{GES\text{-}Rx}$) will be offset by the satellite frequency translation error plus doppler on the downlink due to satellite motion with respect to the GES ($\text{Dplr}_{SAT\text{-}GES\text{-}DN}$).

$$F_{GES\text{-}Rx} = F_{NOM\text{-}DN} + \text{Err}_{SAT} + \text{Dplr}_{SAT\text{-}GES\text{-}DN}$$

By measuring the received frequency and determining the offset from the nominal channel center frequency, the gateway 26 determines a combined downlink error ($\text{Err}_{GES\text{-}Rx}$). By subtracting the calculated downlink doppler, the gateway 26 determines the frequency offset due to satellite frequency translation error.

$$\text{Err}_{GES\text{-}Rx} = F_{GES\text{-}Rx} - F_{NOM\text{-}DN}$$

$$\text{Err}_{SAT} = \text{Err}_{GES\text{-}Rx} - \text{Dplr}_{SAT\text{-}GES\text{-}DN}$$

Based on the satellite ephemeris, each gateway 26 preferably calculates the average frequency error introduced on the L-band uplink and downlink signals in each spot beam 28 due to relative motion of the satellite 24 toward the geographic center of each spot beam ($\text{Dplr}_{SAT\text{-}SPT\text{-}UP}$) and ($\text{Dplr}_{SAT\text{-}SPT\text{-}DN}$) Each gateway 26 broadcasts the satellite frequency translation error and the L-band uplink and downlink doppler errors on the forward control channel in each spot beam 28.

The forward control channel from the gateway 26 is received on the L-band downlink at the mobile terminal 22. At the mobile terminal 22, a received frequency ($F_{MT\text{-}Rx}$) is offset from nominal ($F_{NOM\text{-}DN}$) by the frequency translation error of the satellite ($\text{Err}_{SAT}$) and by doppler due to satellite motion relative to the mobile terminal 22 ($\text{Dplr}_{SAT\text{-}MT\text{-}DN}$).

$$F_{MT\text{-}Rx} = F_{NOM\text{-}DN} + \text{Err}_{SAT} + \text{Dplr}_{SAT\text{-}MT\text{-}DN}$$

Thus, the total doppler seen at the mobile terminal 22 is the sum of doppler due to motion relative to the center of the spot beam ($\text{Dplr}_{SAT\text{-}SPT\text{-}DN}$) and an additional component of doppler ($\text{Dplr}_{MT\text{-}DN}$) due to the mobile terminal's position with respect to the geographic center of the spot beam and due to motion of the mobile terminal 22 on the earth's surface.

$$\text{Dplr}_{SAT\text{-}MT\text{-}DN} = \text{Dplr}_{SAT\text{-}SPT\text{-}DN} + \text{Dplr}_{MT\text{-}DN}$$

When tuning to a gateway earth station 26, in a preferred embodiment, the mobile terminals 22 adjust their receiver 54 to the nominal receive frequency ($F_{NOM\text{-}DN}$) plus translation error ($\text{Err}_{SAT}$) and the downlink doppler error ($\text{Dplr}_{SAT\text{-}SPT\text{-}DN}$) as received from the network control gateway 26:

$$F_{TUNE\text{-}Rx} = F_{NOM\text{-}DN} + \text{Err}_{SAT} + \text{Dplr}_{SAT\text{-}SPT\text{-}DN} = F_{MT\text{-}Rx}$$

The mobile terminal 22 measures the total frequency error received ($\text{Err}_{Mt\text{-}TOTAL}$). The received error observed is due to mobile terminal reference frequency error ($\text{Err}_{MT-REF}$) multiplied to the receive band ($\text{Err}_{MT-REF-Rx}$) plus the additional doppler component ($\text{Dplr}_{Mt-DN}$).

$$\text{Err}_{MT-TOTAL} = F_{TUNE-Rx} = \text{Err}_{MT-REF-Rx} + \text{Dplr}_{MT-DN}$$

In the preferred embodiment, the mobile terminal 22 adjusts its reference oscillator 58 until the observed error ($\text{Err}_{MT-TOTAL}$) is reduced to approximately zero. Since the tuned frequency differs from the received frequency by the doppler due to surface motion and mobile terminal position in the spot beam 28, a residual error ($\text{Err}_{MT-REF}$) equal to $\text{Dplr}_{MT-DN}$ (when multiplied to the receive frequency) remains.

$$F_{TUNE-Rx} + \text{Err}_{MT-REF-Rx} = F_{MT-Rx}$$

$$\text{Err}_{MT-REF-Rx} = \text{Dplr}_{MT-DN}$$

When multiplied to the transmit band, the residual error ($\text{Err}_{MT-REF}$) in the mobile terminal reference introduces an error ($\text{Err}_{MT-REF-Tx}$) into the transmitted frequency ($F_{MT-Tx}$). This error in the transmitted frequency is proportional to the receive band doppler due to mobile terminal motion and position ($\text{Dplr}_{MT-DN}$) and corresponds to the doppler introduced at the uplink ($\text{Dplr}_{MT-UP}$) due to the same motion and position.

$$F_{MT-Tx} = F_{TUNE-Tx} + \text{Err}_{MT-REF-Tx}$$

$$\text{Err}_{MT-REF-Tx} = \text{Dplr}_{MT-UP}$$

When the mobile terminal transmission is received at the satellite 24 ($F_{SAT-Rx-MT}$), the transmission includes doppler ($\text{Dplr}_{SAT-MT-UP}$) due to the relative motion of the satellite 24 and the mobile terminal 22.

$$F_{SAT-Rx-MT} = F_{MT-Tx} + \text{Dplr}_{SAT-MT-UP}$$

The total doppler seen at the satellite 24 is the sum of doppler due to motion relative to the center of the spot beam 28 and an additional component of doppler ($\text{Dplr}_{MT-UP}$) due to the mobile terminals position with respect to the geographic center of the spot beam 28 and motion of the mobile terminal 22 on the earth's surface.

$$\text{Dplr}_{SAT-MT-UP} = \text{Dplr}_{SAT-SPT-UP} + \text{Dplr}_{MT-UP}$$

The frequency seen at the satellite 24 is therefore approximately equal to the nominal uplink frequency ($F_{NOM-UP}$) plus twice the doppler due to mobile terminal motion and position in the spot beam ($\text{Dplr}_{MT}$).

$$F_{SAT-Rx-MT} = F_{NOM-UP} + 2 \times \text{Dplr}_{MT}$$

At the controlling gateway 26, the mobile terminal's transmission is received with additional frequency offset due to satellite translation error and doppler due to satellite motion with respect to the gateway 26.

$$F_{GES-Rx-MT} = F_{NOM-DN} + \text{Err}_{SAT} + \text{Dplr}_{SAT-GES-DN} + 2 \times \text{Dplr}_{MT}$$

When comparing the frequency error seen at the gateway 26 on the loopback control channel to the error seen on the mobile terminal's transmission, the mobile terminal signal is offset by about twice the doppler due to mobile terminal motion and position in the spot beam ($2 \times \text{Dplr}_{MT}$). The gateway 26 will see this offset on an access channel transmission received from the mobile terminal 22. The gateway 26 measures and reports the total error back to the mobile terminal 22 via the access response channel. In the preferred embodiment, the mobile terminal 22 then adjusts its reference oscillator by an amount corresponding to one-half the error reported by the gateway 26. The mobile terminal 22 also preferably adjusts its transmit and receive tuning frequency by one-half of the reported error.

The mobile terminal's reference oscillator is now adjusted to a nominal frequency while the mobile terminal's transmitter and receiver is tuned to a suitable frequency for network operation.

$$F_{TUNE-Rx} = F_{NOM-Rx} + \text{Err}_{SAT} + \text{Dplr}_{SAT-SPT-DN} + \text{Dplr}_{MT} = F_{MT-Rx}$$

$$F_{TUNE-Tx} = F_{NOM-Tx} - \text{Dplr}_{SAT-SPT-DN} - \text{Dplr}_{MT} = F_{MT-Tx}$$

By following the procedure described above, the mobile terminal 22 compensates for frequency offsets due to satellite frequency translation error, satellite motion, mobile terminal motion, and mobile terminal reference oscillator error.

During a call, mobile terminals 22 preferably continue to monitor the forward control channel from the gateway 26. The gateway 26 periodically reports changes in frequency error due to drift of the satellite reference or due to satellite motion via the forward control channel. Preferably, the mobile terminals 22 observe the changing correction terms by monitoring the forward control channel, and adjust their transmit and receive tuning frequencies accordingly.

In addition, the GES 26 participating in the call measures frequency drift due to mobile terminal reference oscillator instability and due to mobile terminal motion near the earth's surface. The GES 26 reports the frequency drift to the mobile terminal 22, such as by using the in-band signaling channel (ISC). Since the frequency drift due to the reference oscillator is typically large compared to that caused by change of motion and location of the mobile terminal 22, the mobile terminal 22 in the preferred embodiment compensates for the reference oscillator drift by adjusting its reference oscillator according to the error reported by the GES 26. Although a small residual error at the mobile terminal reference oscillator still exists due to changes in mobile terminal position and motion, this residual error may be removed at the transmit frequency due to the closed loop operation with the GES 26.

At the receive frequency, the mobile terminal residual error is also removed since the receive frequency change due to mobile terminal motion is proportional to the transmit frequency change due to the same motion in the same way that the transmit and receive frequencies are proportional.

During a mobile to mobile call, each mobile terminal 22 preferably monitors the forward control channel from the controlling gateway 26. The gateway 26 preferably reports changes in frequency error due to drift of the satellite reference or due to satellite motion via the forward control channel. The mobile terminals 22 observe the reported changes from the gateway 26 and accordingly adjust the transmit and receive tuning frequencies.

Frequency drift, generally due to either mobile terminal reference oscillator instability or mobile terminal motion near the earth's surface, in a first mobile terminal 22 is preferably monitored by a second mobile terminal 22 participating in a mobile to mobile call. In the preferred embodiment, drift of the first mobile terminal 22 is determined by monitoring the relative drift between the received forward control channel and the received traffic channel at the second mobile terminal 22. By comparing the frequency of the received traffic channel to the frequency of the forward control channel, the second mobile terminal 22 determines a frequency offset for the first mobile terminal 22. The second mobile terminal 22 reports the observed frequency offset to the first mobile terminal 22, and the first mobile terminal 22 adjusts its reference oscillator to compensate for the reported frequency offset. Preferably, the above method of adjusting for frequency drift in a mobile to mobile call is performed periodically throughout the duration of the call.

Of course, it should be understood that a wide range of changes and modifications can be made to the preferred embodiment described above. For example, although the preferred embodiment focused on telephony communication in a mobile telephone system, the preferred method may also be used in a navigational system, such as the Global Positioning System (GPS). However, since GPS uses multiple satellites, each ground station would receive the position of the source and the satellite ephemeris for the particular satellite sending the transmission. It is therefore intended that the foregoing detailed description be regarded as illustrative rather than limiting and that it be understood that it is the following claims, including all equivalents, which are intended to define the scope of this invention.

What is claimed is:

1. A method of stabilizing a transmission frequency in a mobile satellite communication system comprising the steps of:
    adjusting a transmit frequency of a gateway terminal to compensate for a frequency shift between said gateway and a satellite;
    calculating a frequency offset based on a geographical position of a mobile terminal and predetermined information related to movement of said satellite;
    broadcasting the calculated frequency offset from said gateway terminal to the mobile terminal;
    receiving said frequency offset information transmitted by said gateway in said mobile terminal; and
    adjusting a reference oscillator in said mobile terminal based on said frequency offset information.

2. The method of claim 1, further comprising the steps of:
    adjusting a transmit frequency of said mobile terminal to compensate for said frequency offset.

3. The method of claim 1, further comprising the steps of:
    adjusting a receive frequency of said mobile terminal to compensate for said frequency offset.

4. The method of claim 1, further comprising the steps of:
    transmitting a first signal from said mobile terminal to said gateway;
    receiving a mobile terminal frequency offset from said gateway; and
    adjusting said reference oscillator in said mobile terminal to compensate for said mobile terminal frequency offset.

5. The method of claim 4, wherein said mobile terminal frequency offset comprises mobile terminal motion offset.

6. The method of claim 4, wherein said mobile terminal frequency offset comprises mobile terminal reference oscillator offset.

7. The method of claim 1, further including the steps of:
    placing a call between said mobile terminal and said gateway;
    measuring a mobile terminal frequency offset at said gateway;
    reporting said mobile terminal frequency offset to said mobile terminal;
    adjusting said reference oscillator in said mobile terminal to compensate for said mobile terminal frequency offset.

8. The method of claim 7, further including the step of:
    adjusting a transmit frequency of said mobile terminal to compensate for said mobile terminal frequency offset.

9. The method of claim 7, further including the step of:
    adjusting a receive frequency of said mobile terminal to compensate for said mobile terminal frequency offset.

10. The method of claim 1, wherein said frequency offset information comprises satellite frequency translation offset.

11. The method of claim 1, wherein said frequency offset information comprises satellite motion offset.

12. The method of claim 1, further comprising the step of transmitting a doppler compensated signal from said gateway to said satellite.

13. The method of claim 12, wherein said doppler compensated signal comprises a signal having a frequency substantially equal to a nominal frequency minus a calculated uplink doppler offset.

14. The method of claim 13, further comprising the step of receiving the doppler compensated signal at the satellite, said doppler compensated signal having substantially the same frequency as the nominal frequency signal.

15. The method of claim 1, further comprising the steps of
    transmitting a first signal from said gateway to a satellite;
    translating the frequency of said first signal to produce a second signal;
    transmitting said second signal from said satellite to a mobile terminal;
    monitoring the transmission of the second signal at said gateway;
    calculating a doppler offset for said first signal and for said second signal at said gateway; and
    measuring a satellite frequency translation offset at said gateway by comparing the frequency of said first signal, the frequency of said second signal, and the doppler offset.

16. The method of claim 15, further including the step of:
    adjusting a transmit frequency of said mobile terminal to compensate for said mobile terminal frequency offset.

17. The method of claim 16, further including the step of:
    adjusting a recieve frequency of said mobile terminal to compensate for said mobile terminal frequency offset.

18. A mobile satellite communication system comprising:
    a plurality of mobile terminals, each mobile terminal having a mobile terminal reference oscillator;
    a satellite adapted to communicate with each of said mobile terminals, said satellite having a satellite reference oscillator;
    at least one gateway in communication with said satellite, said gateway having a high-stability reference oscillator and a digital processor, said digital processor including a routine for calculating a frequency offset for each of the plurality of mobile terminals based on the geographical position of each of the plurality of mobile terminals and predetermined information related to movement of the satellite;
    said gateway transmitting one of said frequency offsets to one of said mobile terminals, said one mobile terminal receiving said frequency offset and adjusting said mobile terminal reference oscillator to compensate for said received frequency offset.

19. The system of claim 18, wherein said mobile terminal frequency offset comprises mobile terminal motion offset.

20. The system of claim 18, wherein the one of said mobile terminal frequency offsets includes a mobile terminal reference oscillator offset.

21. The system of claim 18, wherein the one of said mobile terminal frequency offsets includes a mobile terminal reference oscillator drift, and said gateway periodically transmits said one frequency offset to said one of said mobile terminals.

22. The system of claim 18, wherein said satellite communicates with said mobile terminals by transmitting and receiving signals over a plurality of spot beams, each spqt beam having a coverage region and at least one control channel;

said routine calculates a plurality of frequency offsets, each calculated frequency offset associated with one of said spot beams and calculated based on the position of said coverage region for said associated spot beam; and said gateway transmits said plurality of frequency offsets over said control channels to said mobile terminals.

23. The system of claim 18, wherein said gateway calculates a satellite frequency offset and transmits said satellite frequency offset to said satellite, said satellite adjusting said satellite reference oscillator to compensate for said received satellite frequency offset.

24. The system of claim 23, wherein said satellite frequency offset comprises satellite frequency translation offset.

25. The system of claim 23, wherein said frequency offset comprises satellite motion offset.

26. A gateway earth station in a mobile satellite communication system comprising:

an antenna for receiving and transmitting Ku-band signals;

a base transceiver station coupled to the antenna, said base transceiver station including a digital processor, said digital processor including a first routine for calculating a frequency offset based on a geographical position of a mobile terminal and on predetermined information pertaining to movement of a satellite, said base transceiver station transmitting said frequency offset to said satellite via the antenna; and a high-stability reference oscillator coupled to the base transceiver station, said high-stability reference oscillator providing a reference frequency to the base transceiver station.

* * * * *